United States Patent [19]

Douglas

[11] Patent Number: 4,702,795
[45] Date of Patent: Oct. 27, 1987

[54] TRENCH ETCH PROCESS

[75] Inventor: Monte A. Douglas, Dallas, Tex.

[73] Assignee: Texas Instruments Incorporated, Dallas, Tex.

[21] Appl. No.: 730,701

[22] Filed: May 3, 1985

[51] Int. Cl.[4] .................. H01L 21/306; B44C 1/22; C03C 15/00; C03C 25/06

[52] U.S. Cl. .................. 156/643; 156/646; 156/648; 156/657; 156/659.1; 156/662; 204/192.32; 357/73.6; 357/55; 437/225; 437/919

[58] Field of Search ............. 156/643, 646, 648, 657, 156/659.1, 662; 252/79.1; 29/576 W, 580; 427/93; 204/192 EC, 192 E, 192.32, 192.22; 357/23.6, 41, 43, 49, 50, 51, 55

[56] References Cited

U.S. PATENT DOCUMENTS

| 4,104,086 | 8/1978 | Bondur et al. | 156/648 X |
| 4,326,332 | 4/1982 | Kenney | 156/648 X |
| 4,533,430 | 8/1985 | Bower | 156/643 |

Primary Examiner—William A. Powell
Attorney, Agent, or Firm—Douglas A. Sorensen; Leo N. Heiting; Mel Sharp

[57] ABSTRACT

A plasma dry etch process for etching deep trenches in single crystal silicon material with controlled wall profile, for trench capacitors or trench isolation structures. HCl is used as an etchant under RIE conditions with a SiO2 hard mask. The SiO2 hard mask is forward sputtered during the course of the Si etch so as to slowly deposit SiOx (x<2) on the sidewalls of the silicon trench. Since the sidewall deposit shadows etching at the bottom of the trench near the sidewall, the effect of this gradual buildup is to produce a positively sloped trench sidewall without "grooving" the bottom of the trench, and without linewidth loss. This process avoids the prior art problems of mask undercut, which generates voids during subsequent refill processing, and grooving at the bottom of the trench, which is exceedingly deleterious to thin capacitor dielectric integrity.

16 Claims, 7 Drawing Figures

TRENCH ETCH PROCESS

BACKGROUND AND SUMMARY OF THE INVENTION

The present invention relates to integrated circuits incorporating trench structures and to methods for fabricating such integrated circuits.

Fabrication of trenches—i.e. grooves etched in the substrate of an integrated circuit which have an aspect ratio greater than 2.5:1, or a width less than 3 microns and a depth greater than one micron—is desirable in several areas of VLSI processing, but this fabrication step presents several distinctive difficulties, at which the present invention is aimed.

Current VLSI trends in CMOS and bipolar technologies require the development of nonencroachment isolation techniques to improve utilization of silicon area for active device fabrication while effectively reducing latch-up susceptibility. That is, when LOCOS isolation is used to separate moat (active device) regions, the field oxide will grow laterally to encroach on the moat regions at the same time it is grown to its desired thickness. This is also a problem with other isolation technologies: the separation required between nearest-neighbor active devices across the isolation structure is likely to be many times the minimum geometry. The need for compact isolation is particularly critical to CMOS VLSI efforts, since present doping levels limit N-to-P tank spacing to 4 to 6 microns. To reduce the required n+ to p+ spacing, silicon trench dry etch processing may be employed to generate deep yet narrow silicon wells between cells that are subsequently refilled with CVD oxide or polysilicon to effect device isolation while maintaining high density and still avoiding latchup.

Another area where trench processing is a critical need is in DRAMs (dynamic random access memories). Higher packing densities may be achieved for dynamic MOS memories if the cell area consumed by the planar storage capacitor can be decreased without decreasing the capacitance below soft error levels. This can be achieved by placing the capacitor dielectric on the sidewalls of a silicon trench etched sufficiently deep to have the equivalent surface area of the planar capacitor.

However, the characteristics of the silicon trench must be carefully controlled to achieve satisfactory results when integrated with such applications. The trench cross-sectional profile is of particular concern; for instance, trench profiles where the silicon is undercut with respect to the patterning mask or where "grooving" is exhibited near the bottom of the trench are commonly observed with conventional trench etch processing. Even minutely undercut sidewall profiles will readily promote void formation during the subsequent CVD refill operations commonly used in both trench isolation and trench capacitor processing. These voids are a problem because they can act as a contaminant depository. Moreover, a later etchback step may reopen the void, producing huge filament problems if a conductor is sought to be patterned thereafter. Moreover, etchback to achieve a truly planar surface within the trench, as is desirable for some advanced processes, becomes impossible. The trench bottom "grooving" can also be exceedingly deleterious: it can degrade the dielectric integrity of a trench capacitor and can promote high, stress-related Si defect densities during thick thermal oxidation.

"Grooving" is believed to be due to nonuniformity generated at the beginning of the etch process. That is, near the beginning of the etch process, the edges of the trench will be exposed to bombardment both by ions coming straight in and by ions which have been slightly deflected by the sidewalls of the trench or by the hard mask, so that the trench will be etched slightly deeper at its edges than near its center. This nonuniformity can be carried forward to the later stages of etching, by the complex effects of autosputtering, so that a trench etched using prior art methods is very likely to have grooves in its bottom next to its sidewalls.

Thus it is an object of the present invention to provide a silicon trench etch which will provide a trench without grooves or spikes or other undesirable topography on the floor of the trench.

A further problem of the prior art is a peculiar form of undercut which may be referred to as retrograde undercut, or bowing. This is different from the ordinary forms of undercut in that the amount of undercut will be almost zero next to the mask, and will typically increase with depth for a distance of a micron or so. This retrograde undercut is believed to be due to scattering of ions from the mask. material at the opposite edge of the trench.

Thus it is an object of the present invention to provide a silicon trench etch which will provide a trench with straight (unbowed) sidewalls, and without grooves or other undesirable topography on the floor of the trench.

In the prior art, the natural way to achieve control of trench profile would be to make the etch conditions slightly less anisotropic, e.g. by increasing pressure. However, this approach does not work, for several reasons: first, more isotropic etches make the eventual width of the trench less controllable. Second, if the trench sidewall is anywhere near vertical (as is necessary to retain the advantages which motivate use of a trench in the first place), merely using a more isotropic etch will still tend to produce undercut near the top of the trench, so that voids occur during refill. If the anisotropicity is reduced enough that voids do not occur, the "trench" structure will be so wide that the compact spacing which is much of the object of using trenches will be lost.

The present invention solves these and other problems of the prior art by providing a silicon trench etch process that takes advantage of a selective sidewall deposition to eliminate "grooving" and to provide positively sloped trench sidewalls, conducive to subseqent successful refill processing, without sacrificing linewidth control. The present invention exhibits oxide sidewall deposition that takes place in a slow, continuous, and uniform fashion during the silicon trench etching step. (This is thought to be achieved because portions of the mask are forward sputtered during the etch process, and portions of the forward sputtered mask material (possibly in combination with silicon etch products) produce a thin deposited non-stoichiometric oxide on the sidewalls of the trench as etching proceeds.) In this manner, the deeper portions of the silicon etch are defined on the pattern edge by the sidewall oxide, generating sloped silicon sidewalls as the deposition builds up. In addition, the sidewall deposition prevents "grooving" at the trench bottom. This is probably attributable to a shadowing by the deposition of the trench bottom edge and/or a difference in the ion deflection coefficient off of oxide versus silicon.

In the prior art, there has been experimentation with chemistries which slowly deposit silicon oxide while etching silicon trenches to achieve much higher "selectivity" to the mask SiO2. See Horwitz, Reactive Sputter Etching of Silicon with Very Low Mask-material Etch Rates, 28 IEEE Transactions on Electron Devices 1320, which is hereby incorporated by reference. However, this prior art attempt led to uncontrolled deposition: since the deposited oxide is sourced from the gas flow, its deposition locations are determined by the gas flow, and are not (as in the present invention) conveniently and reliably located with respect to the etching process. In the reported prior art, the sidewall oxide deposition had negative consequences in terms of the wall profile, promoting some degree of effective undercut of the mask.

A particular advantage of this processing innovation is that it produces trenches having a straight, sloped sidewall, without grooving at the bottom or undercut at the top, wherein the slope of the sidewall is steep but controllable. The processing parameters which are controlled to vary the trench sidewall slope are the DC self-bias voltage of the silicon etch step, and the introduction of a small amount of a species such as BC13 which tends to produce oxide etching. That is, sidewall oxide deposition will be completely eliminated if 3-5 sccm of BC13 is introduced into the silicon etch mixture, and introduction of lesser amounts of BC13 will reduce sidewall oxide deposition and therefore steepen the sidewall angle of the trench being etched. Thus, the present invention provides a reproducible process for fabricating trenches having a controlled sidewall slope at a predetermined angle between 80 and 89 degrees, and a flat trench bottom.

This structure is itself novel, since there has hertofore been no way to make such an ideal trench. The availability of precisely controlled steep sidewall slope is highly advantageous, since it means that implanting steps can (if desired) reach the sidewalls of the trench. This may be particularly desirable in trench isolation applications, where such an implant can be used to remove the leakage path due to turnon of the parasitic transistor at the face of the trench sidewall. It may also be useful in trench capacitor applications, where such an implant can serve as a "Hi-C" implant, or may serve other purposes. (In this case, the hard mask could be made of a composite material, such as oxide/nitride/oxide or poly/oxide, so that some of the hard mask would be left to keep the trench mask pattern for implanting after the throat-choking oxide is removed.)

According to the present invention there is provided; A process for etching trenches in silicon, comprising the steps of: providing a patterned hard mask over a silicon substrate; plasma etching exposed portions of said silicon substrate under etch conditions such that the material of said hard mask is forward sputtered to induce deposition on sidwalls of said trench during etching.

According to the present invention there is provided: A process for etching trenches in silicon, comprising the steps of: providing a silicon substrate having thereon a patterned hard mask comprising silicon oxides and being defined to expose said silicon only in predetermined trench locations; etching a trench in said predetermined trench locations of said silicon substrate under conditions such that oxides of silicon are continually deposited on sidewalls of said trench during etching, wherein substantially all of the atomic oxygen in said oxides on said trench sidewalls derives from said hard mask.

According to the present invention there is provided: An integrated circuit incorporating trench capacitors, comprising: a dynamic random access memory comprising an array of memory cells, said cells in said array individually comprising a pass transistor in series with a storage capacitor, at least one plate of said storage capacitor being formed in silicon at the face of a trench; wherein said trench has straight sidewalls without bowing or undercut at a positive sidewall angle in the range of 80 to 89 degrees.

According to the present invention there is provided: An integrated circuit including trench isolation, comprising: a silicon substrate including therein a plurality of active device areas comprising transistors; a plurality of trenches separating said active device areas in a predetermined isolation pattern; wherein each said trench has straight sidewalls without bowing or undercut at a positive sidewall angle in the range of 80 to 89 degrees.

BRIEF DESCRIPTION OF THE DRAWING

The present invention will be described with reference to the accompanying drawings, wherein.

DESCRIPTION OF THE PREFERRED EMBODIMENTS

Several sample embodiments will be described in detail, but the details given are illustrative and do not circumscribe the scope of the invention, which is expressly not limited except by the appended claims.

Figure 1:
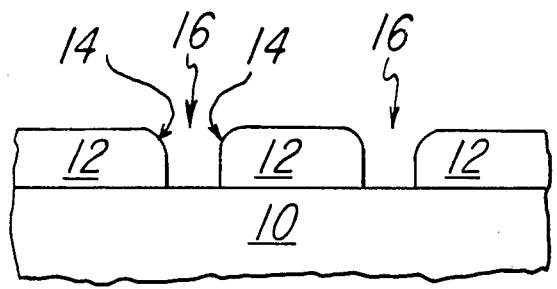
FIG. 1 shows a first step in practising a sample embodiment of a process according to the present invention.

FIG. 1 shows a first step in practising a sample embodiment of a process according to the present invention. A patterned hard mask 12 of silicon dioxide is in place on a silicon substrate 10, defining openings to expose the substrate 10 at predetermined trench locations 16.

A silicon trench etch is now conducted. In this sample embodiment, this etch is conducted in a hexode-style, RIE batch reactor under the following conditions:

Step one:
HCl 40 sccm

BC13 10 sccm
PRESSURE 15 milliTorr
BIAS −300 volts
TEMP 60 degrees C.
TIME 5 minutes
  Step two:
HC1 40 sccm
CL2 5 sccm
PRESSURE 15 milliTorr
BIAS −400 volts
TEMP 60 degrees C.
TIME in accord with etch depth required; for example, about 40 minutes to etch a 3 micron trench.

The first step of the etch serves to cut through the native oxide which silicon will typically form on even brief exposure to air. Gas flow rates are specified as sccm, i.e. standard cubic centimeters per minute. The etch conditions used correspond to an area power density of about 400 milliWatts per square centimeter, and to a volumetric plasma power density of about 7 Watts per liter.

Naturally, these etching conditions can be widely varied. In general, a wide variety of prior art conditions can be used, as long as they give forward sputtering (and/or reactive redeposition) of the hard mask. However, there are some particular advantages to the etch composition given. For example, use of HCl rather than Cl2 as the primary source of chlorine means that mask forward sputtering is enhanced, since bombardment is predominantly by Cl+ ions rather than Cl2+ ions and therefore occurs at higher ion velocity. In fact, it has been found that use of HCl rather than Cl2 as the predominant etch feed gas component contributes substantially to the success of the present inventive process. (In general, in modifying the present invention, etchant ion species is one of the variables which can be adjusted to control the amount of sidewall deposition and therefore the resulting trench profile.) Some of the advantages of HCl may be due to the fact that it is also likely to be a source of atomic hydrogen, which may play a role in the sidewall deposition. However, a minority fraction of Cl2 increases the etch rate without degrading the sidewall oxide deposition characteristics. Use of higher pressures for step two tends to produce pointed trench bottoms; use of lower pressure will reduce the etch rate. Use of lower bias voltage will reduce sidewall oxide deposition and etch rate, and (if more lower) will begin to lead to isotropic etching characteristics. Use of a higher bias will erode the oxide mask, leading to loss of linewidth control. As noted, introduction of a small amount of an inorganic chloride such as BC13 will facilitate oxide etching, and therefore retard deposition of the sidewall oxide, and therefore produce a steeper trench sidewall.

Another factor which affects the degree of forward sputtering, and therefore the trench sidewall angle, is the initial sidewall slope of the hard mask sidewalls. That is, in FIG. 1 the sidewalls 14 of the oxide hard mask 12 are preferably not quite at a 90 degree angle: angles of 80 to 89 degrees are preferred. More sloped hard mask sidewalls will in general lead to more hard mask forward sputtering, although excessive hard mask sidewall slope will lead to mask faceting and loss of control over linewidth, and possible silicon damage at the upper corners of the trench.

The silicon etch conditions used are preferably highly anisotropic (like those described above), so that control of the trench sidewall slope is entirely dependent on the sidewall deposition characteristics. However, the present invention could also be used with silicon etch conditions which were not so inherently anisotropic, although this is not preferred.

After the trench has been etched to the desired depth, a clean up step is preferably used (depending on the particular device fabrication sequence used) to remove the oxide from the sidewalls of the etched trench. This can be, for example, a short wet etch in HF or a short high-pressure plasma fluoro-etch.

Note that the general idea of trench etching using forward sputtering (or reactive redeposition) of a hard mask is itself novel, and can be embodied in a tremendous range of modifications and variations. For example, other hard mask materials, such as silicon nitride or even photoresist can be used, although oxide hard masks are greatly preferred to provide more controllable forward sputtering with good control of mask erosion. Photoresist masks turn out to be more sensitive to the initial sidewall angle of the mask material.

Figure 2:
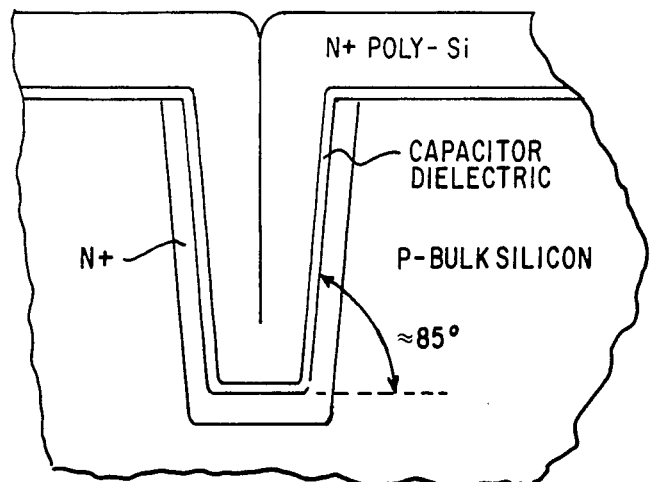
FIG. 2 shows a sample 3 micron deep trench etched and subsequently processed to generate a trench capacitor for a megabit dynamic RAM.
Figures 3A, 3B:
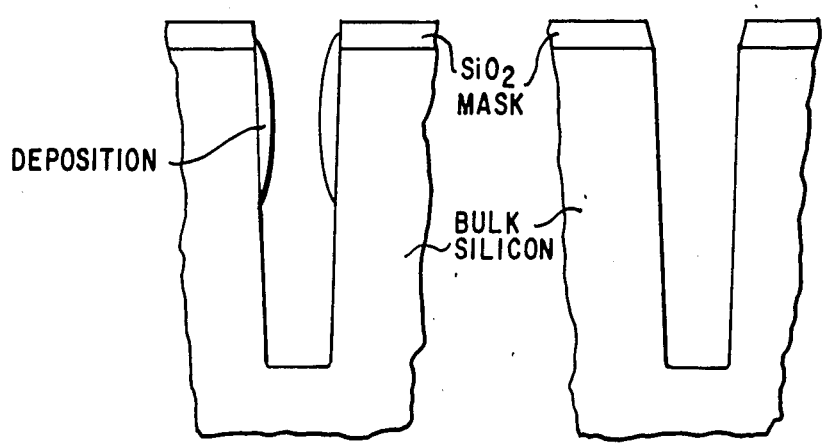
FIGS. 3a and 3b show examples of sidewall deposition on a silicon trench observed (FIG. 3a) immediately after etch and (FIG. 3b) after its elimination with a 30 second 10% HF dip.
Figure 4:
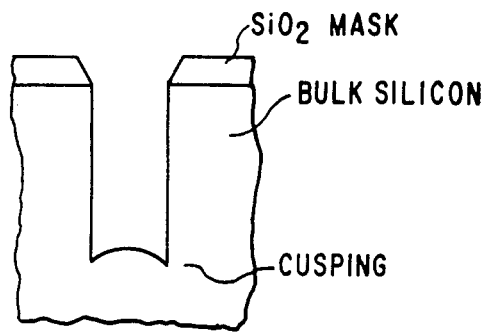
FIG. 4 dramatically illustrates the effect of eliminating sidewall deposition during silicon etch employing a modified trench etch process. Without the sidewall oxide, severe grooving and moderate undercut are observed.

FIG. 2 shows a sample 3 micron deep trench etched and subsequently processed to generate a trench capacitor for a megabit dynamic RAM. FIG. 3 shows examples of sidewall deposition on a silicon trench observed (FIG. 3a) immediately after etch and (FIG. 3b) after its elimination with a 30 second 10% HF dip. FIG. 4 dramatically illustrates the effect of eliminating sidewall deposition during silicon etch employing a modified trench etch process. Without the sidewall oxide, severe grooving and moderate undercut are observed.

Figure 5:
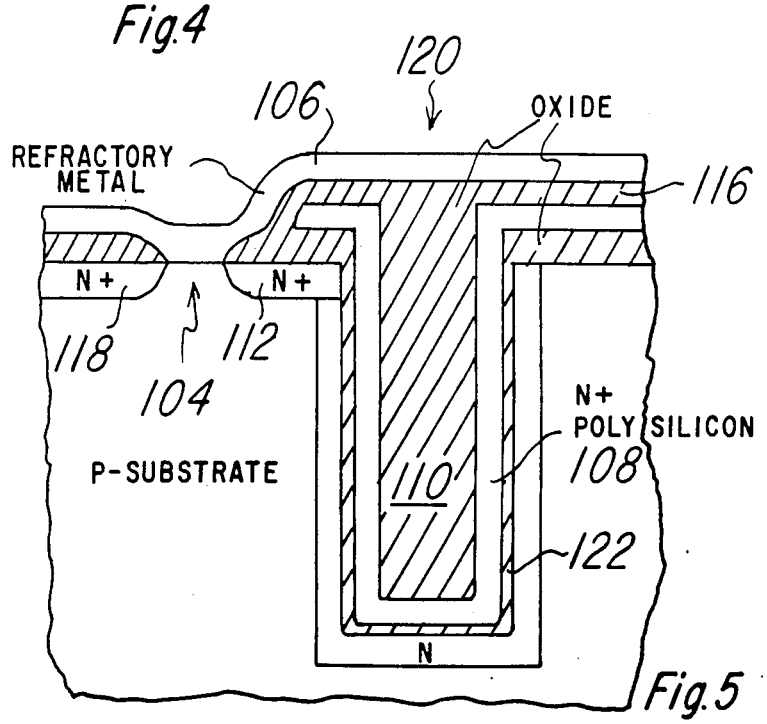
FIG. 5 shows a sample DRAM cell employing a trench capacitor wherein the trench has positively sloped steep sidewalls and a flat bottom according to the present invention.

FIG. 5 shows a sample DRAM cell employing a trench capacitor wherein the trench has positively sloped steep sidewalls and a flat bottom according to the present invention. A pass transistor 104, addressed by a refractory metal gate 106, connects a bit line 118 to an N+ diffusion 112 which forms one plate of the trench capacitor, the other being polysilicon layer 108. The trench capacitor is formed in a trench 120 which has straight positively-sloped sidewalls. A thin oxide 122 provides the dielectric for the trench capacitor, and an oxide 110 refills the trench. A patterned oxide 116 provides isolation.

Figure 6:
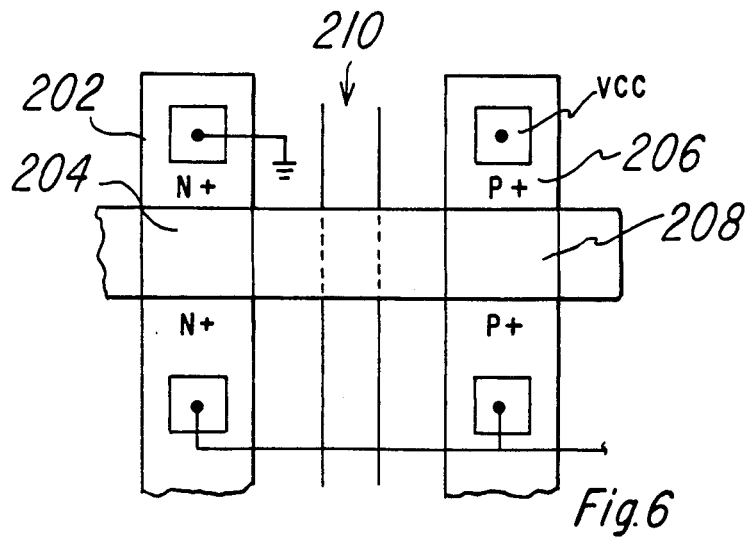
FIG. 6 shows an example of a CMOS structure employing trench isolation, wherein n+ to p+ spacing is reduced by use of an oxide-filled trench having positively sloped steep sidewalls and a flat bottom.

FIG. 6 shows an example of a CMOS structure employing trench isolation, wherein the spacing permissible between n+ diffusion 202 in NMOS transistor 204 and p+ diffusion 206 in PMOS transistor 208 is reduced by use of an oxide-filled trench 210, which has positively sloped steep sidewalls and a flat bottom, for isolation.

Thus the present invention provides several crucial advantages over the prior art, including among others the following: a positively sloped silicon trench sidewall without undercut is provided, which permits facile subsequent refill processing; the positive sidewall slope is achieved without a sacrifice in control of the pattern dimension; and the "grooving" problem, commonly observed at the bottom of the trench, is eliminated, and instead a good flat trench bottom is provided.

The present invention has been described with reference to various illustrative sample embodiments, but the novel concepts of the present invention can be incorporated in a tremendous range of modifications and variations, and accordingly the scope of the present invention is expressly not limited except as set forth in the claims.

What is claimed is:
1. A process for etching trenches in silicon, comprising the steps of:

providing a patterned mask over a silicon substrate;

plasma etching exposed portions of said silicon substrate under etch conditions such that the material of said mask is forward sputtered to induce deposition on sidewalls of said trench during etching.

2. A process for etching trenches in silicon, comprising the steps of:

providing a silicon substrate having thereon a patterned hard mask comprising silicon oxides and being defined to expose said silicon only in predetermined trench locations;

etching a trench, by means of a plasma source of silicon etchant ions, in said predetermined trench locations of said silicon substrate under conditions such that oxides of silicon are continually deposited on sidewalls of said trench during etching, wherein substantially all of the atomic oxygen in said oxides on said trench sidewalls derives from said hard mask.

3. The process of claim 1, wherein said mask consists essentially of silicon oxides, and wherein said trench etch comprises plasma etching in an etch gas containing chlorine-bearing species, and said chlorine-bearing species consist predominantly of hydrogen chloride.

4. The process of claim 1, wherein said mask consists essentially of silicon oxides, and wherein said trench etch comprises plasma etching in an etch gas which provides a source of Cl+ ions in greater quantity than of Cl2+ ions.

5. The process of claim 1, wherein said trench etch is performed at a total pressure in the range of 1 to 100 milliTorr.

6. The process of claim 1, wherein said openings in said mask have a sidewall angle, prior to said trench etch, in the range of 80 to 89 degrees.

7. The process of claim 1, wherein said trench etch is performed at a bias voltage in the range of 250 to 550 volts.

8. The process of claim 2, wherein said mask consists essentially of silicon oxides, and wherein said trench etch comprises plasma etching in an etch gas containing chlorine-bearing species, and said chlorine-bearing species consist predominantly of hydrogen chloride.

9. The process of claim 2, wherein said mask consists essentially of silicon oxides, and wherein said trench etch comprises plasma etching in an etch gas which provides a source of Cl+ ions in greater quantity than of Cl2+ ions.

10. The process of claim 2, wherein said trench etch is performed at a total pressure in the range of 1 to 100 milliTorr.

11. The process of claim 2, wherein said openings in said mask have a sidewall angle, prior to said trench etch, in the range of 80 to 89 degrees.

12. The process of claim 2, wherein said trench etch is performed at a bias voltage in the range of 250 to 550 volts.

13. The process of claim 2, wherein said trench etching plasma includes a small fraction of an oxide-etching species, said small fraction being preselected to adjust the rate of deposition of said sidewall oxides.

14. The process of claim 2, wherein said plasma etching is performed at a volumetric power density in the range of 5 to 10 Watts per liter.

15. The process of claim 2, wherein said trench etch comprises plasma etching in an etch gas comprising hydrogen chloride.

16. The process of claim 1, wherein said trench etch comprises plasma etching in an etch gas comprising hydrogen chloride.

* * * * *